US 6,661,028 B2

(12) United States Patent
Chen et al.

(10) Patent No.: US 6,661,028 B2
(45) Date of Patent: Dec. 9, 2003

(54) INTERFACE TEXTURING FOR LIGHT-EMITTING DEVICE

(75) Inventors: Tzer-Perng Chen, Hsinchu (TW); Chih-Sung Chang, Taipei (TW); Holin Chang, Kaohsiung (TW)

(73) Assignee: United Epitaxy Company, Ltd., Hsinchu (TW)

( * ) Notice: Subject to any disclaimer, the term of this patent is extended or adjusted under 35 U.S.C. 154(b) by 0 days.

(21) Appl. No.: 10/143,985

(22) Filed: May 14, 2002

(65) Prior Publication Data

US 2002/0134985 A1 Sep. 26, 2002

Related U.S. Application Data

(63) Continuation-in-part of application No. 09/630,590, filed on Aug. 1, 2000, now Pat. No. 6,410,348.

(51) Int. Cl.$^7$ .......................... H01L 27/15; H01L 31/12; H01L 33/00
(52) U.S. Cl. .......................................... 257/79; 257/918
(58) Field of Search ............................... 257/76, 78, 79, 257/82, 88, 200, 201, 544, 614, 615, 911, 918

(56) References Cited

U.S. PATENT DOCUMENTS

| | | | |
|---|---|---|---|
| 3,739,217 A | | 6/1973 | Bergh et al. |
| 4,225,380 A | | 9/1980 | Wickens |
| 5,135,877 A | | 8/1992 | Albergo et al. |
| 5,349,210 A | | 9/1994 | Ackley et al. |
| 5,601,731 A | * | 2/1997 | Hillmer .......................... 216/2 |
| 5,779,924 A | * | 7/1998 | Krames et al. ................ 216/24 |
| 6,410,348 B1 | * | 6/2002 | Chen et al. ..................... 438/9 |

* cited by examiner

Primary Examiner—David Nhu

(57) ABSTRACT

The present invention discloses a light-emitting device (LED) with a textured interface formed by utilizing holographic lithography. Two coherent light beams are overlaid to cause constructive and destructive interference and thereby periodical alternative bright and dark lines are formed. A wafer coated with a photoresist material is exposed under the interference lines. After a developing step, a photoresist pattern with textured surface is formed on the wafer. Thereafter, the textured photoresist pattern is transferred to the wafer by etching process and result in a desired light-emitting device with a textured interface.

6 Claims, 4 Drawing Sheets

US 6,661,028 B2

INTERFACE TEXTURING FOR LIGHT-EMITTING DEVICE

CROSS REFERENCE TO RELATED APPLICATION

The invention is a continuous in part of the application filed on Aug. 1, 2000, with an application Ser. No. 09/630,590 now U.S. Pat. No. 6,410,348 and entitled "INTERFACE TEXTURING FOR LIGHT-EMITTING DEVICE".

FIELD OF THE INVENTION

The present invention relates to a light-emitting device (LED), and more particularly to a LED with a textured interface, which can improve lightness of the LED.

BACKGROUND OF THE INVENTION

In recent years, some kinds of light-emitting device (LED) are developed and applied in flat-panel displayer (FPD). Among the LEDs, semiconductor light-emitting diodes are rapidly developed and generally used in indoor and outdoor displaying.

FIG. 1 shows a cross-sectional view of semiconductor light-emitting diodes. An epitaxial layer 20 having a p-n junction active layer 24, a window layer 22, and a window layer 26 is stacked on a semiconductor substrate 10. The epitaxial layer 20 is usually made of gallium arsenide (GaAs) related compound, such as GaAs and AlGaAs, and the energy gap of the p-n junction active layer 24 is smaller than that of the window layer 22, i.e. if a material of the p-n junction active layer 24 is $Al_xGa_{1-x}As$ and a material of the window layer 22 is $Al_yGa_{1-y}As$, an aluminum content x of p-n junction active layer 24 is smaller than an aluminum content y of the window layer 22 and is greater than or equal to 0. Besides, the epitaxial layer 20 can also be made of GaInP or AlGaInP, and the energy gap of the p-n junction active layer 24 is smaller than that of the window layer 22, i.e. if a material of the p-n junction active layer 24 is $(Al_xGa_{1-x})_zInP$ and a material of the window layer 22 is $(Al_yGa_{1-y})_zInP$, an aluminum content x of p-n junction active layer 24 is smaller than an aluminum content y of the window layer 22 and is greater than or equal to 0. Electrodes 30 are formed on the top and the bottom of the stack layer. By injecting electric current, the p-n junction active layer 24 is "activized" and emitted, and thereby a light beam L is ejected out.

According to light refracting law, while a light beam in medium (I) ejects to medium (II), it must satisfy phase-matching condition to allow power transmission. That is, it must satisfy $\sin(\theta_1)*n_1=\sin(\theta_2)*n_2$, wherein $\theta_1$ and $\theta_2$ are the incident angle to the interface, and $n_1$ and $n_2$ are the material index of refraction. Otherwise, reflection will be occurred and the light beam cannot be transmitted into the medium (II). When the refraction index of medium (I) is greater than medium (II), the incident angle θ must smaller than critical angle $\theta_C=\arcsin(n_2/n_1)$, or else the total internal reflection will be occurred and the light beam does not propagate into medium (II).

For semiconductor LED, the semiconductor material has refraction index (n~2.2–2.8) much greater than ambient, such as air (n~1) or transparent epoxy (n~1.5). When the light beam L from the semiconductor LED propagates to ambient and has an incident angle θ greater than critical angle $\theta_C$, total reflection is happened thereby limiting the external quantum efficiency of the semiconductor LED.

As shown in FIG. 1, the p-n junction active layer 24 is emitted and generates light beam L. For example, GaAs or GaInP related compound, such as GaAs ($n_1$~3.65), and epoxy ($n_2$~1.5) are used. Light beam L can be transmitted through the interface between GaAs and the epoxy layer if the incident angle θ smaller than critical angle θc, else light beam L will be total reflected to light beam L' and be again total reflected to light beam L". Therefore, the light beam L will be continuously total reflected in the epitaxial layer 20, and finally be absorbed under the reflection path or escaped from the sidewall.

For critical angle θc=24.27°, isotropic point source of light within the GaAs, the fraction of light emitted into the epoxy is only (1−cos θc)/2=4.4% of the available emitted light. For a cubic-shaped device having a completely reflective bottom surface, no top contact, and no internal absorption, there are six such interfaces and the fraction of total emitted light escaping the LED is 6×4.4%=26.4%. There is still a wide range for improving the extraction efficiency.

Hence, several methods for improving the light extraction from a LED have been proposed. One method is to change the macroscopic geometry of the LED to allow all or most of the light generated within the device to enter an escape cone at the interface with the ambient. Carr in Infrared Physics 6.1 (1996) observed that truncated cones, truncated pyramids, etc., can improve extraction efficiency. Dierschke, et al. in Applied Physics Letters 19.98 (1971) also noted large improvements in extraction efficiency for a hemispherical device. However, macroscopic shaping methods are costly and have associated manufacturability issues, such as inefficient material utilization and complicated fabrication processes and techniques.

In additional, Arpad, et al. in U.S. Pat. No. 3,739,217 described that another method is random texturing or roughening of the surfaces of the semiconductor LED, as shown in FIG. 2. This randomization increases the overall probability that light L will enter an escape cone after many multiple passes through the device structure. But, each random texturing of the surfaces of the semiconductor LED is different, and much light is absorbed before escaping. These result in the extraction efficiency of each semiconductor LED is hardly controlled.

SUMMARY OF THE INVENTION

The present invention provides an interface texturing for a light-emitting device (LED). An ordered interface texturing is formed in the LED by using holographic lithographic techniques. The incident angle of the light total reflected in the textured interface can be changed in next time, and the probability of transmission in the interface can be improved. Therefore the total extraction efficiency can be increased.

The present invention provides a semiconductor epitaxial structure for a light-emitting device comprising: a first window layer; a p-n junction active layer stacked on the first window layer; and a second window layer stacked on the p-n junction active layer, and the second window layer having a textured surface, wherein the textured surface is caused by a plurality of interference lines formed by a plurality of overlaid coherent light beams.

The present invention further provides a light-emitting device comprising: a luminescent layer having a textured surface, wherein the textured surface of the luminescent layer is caused by at least one projection of light interference lines formed by a plurality of overlaid coherent light beams. The luminescent layer can be such as an epitaxial layer of a semiconductor LED.

BRIEF DESCRIPTIONS OF THE DRAWINGS

DETAILED DESCRIPTIONS OF THE INVENTION

The present invention discloses a light-emitting device with a textured interface formed by using holographic lithography techniques. Two coherent light beams are overlaid to form interference lines and projects the interference lines to a wafer coating with a photoresist material to perform an exposure step. After developing step, an ordered textured pattern is formed on the surface of the phtoresist layer. The textured pattern is transferred to the wafer by etching process to form desired interface texturing on the wafer. The extraction efficiency of the device can be therefore improved by the interface texturing according to the present invention.

Figure 1:
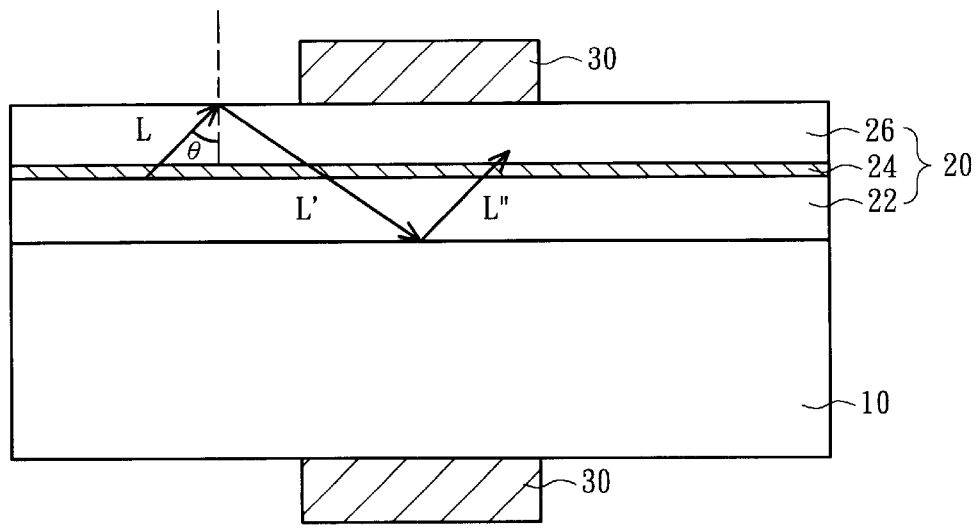
FIG. 1 shows a schematic view of a prior art semiconductor light-emitting device.
Figure 2:
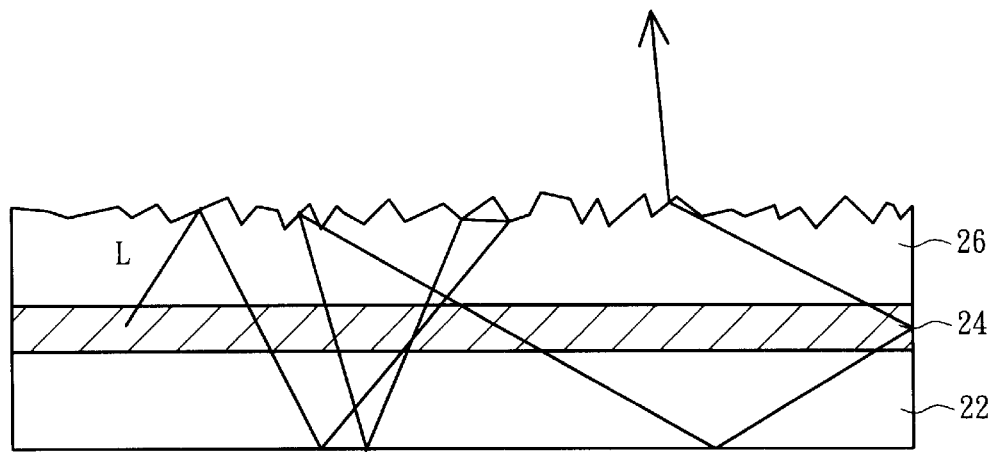
FIG. 2 shows a schematic view of random texturing of the interface of the LED by using chemical or mechanical processes.
Figure 3:
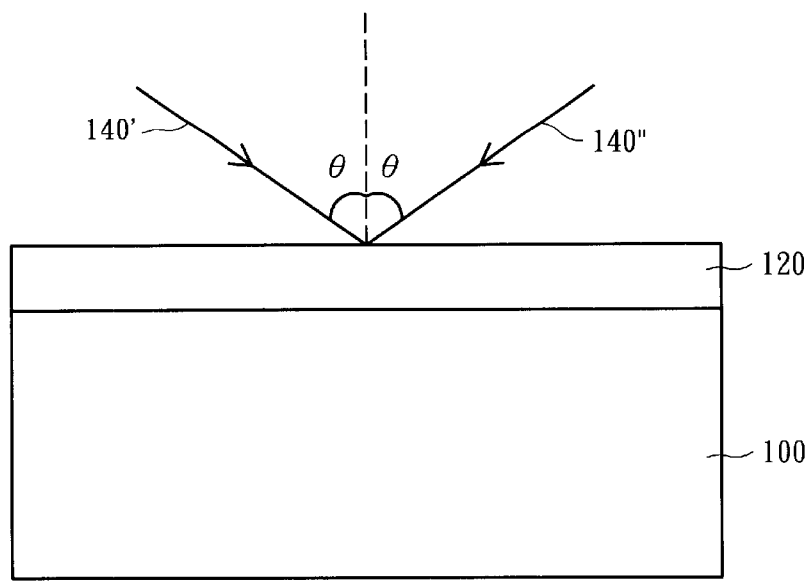
FIG. 3 shows two coherent laser light beams are overlaid in a predetermined angle to form interference lines projected to a wafer coating with a photoresist material.

Referring to FIG. 3, now the basic principle of fabricating the interface texturing of the present invention will be presented. According to interference principle of the light, if two light beams are coherent, as shown the number 140' and 140" in FIG. 3, i.e. they have fixed phase difference to each other, when the two light beams are overlaid, there is a partial increasing and decreasing effect to cause a constructive and destructive interference, and results in interference lines having periodically alternative bright lines and dark lines. If the wavelength of the light beams both are λ and incident angles relative to perpendicularity of the target surface both are θ, the period of the resulting interference lines is Λ=λ/2n sin θ. Therefore, one-dimension periodical interference lines are formed. If light distance difference is in the range of the coherence, a high resolutive interference will be produced.

The interference lines of light are projected to a substrate 100 coating with a photoresist layer 120 to perform the exposure step. Each portion of the photoresist layer 120 will have different exposure depth for the periodical light density. After a developing step, periodical wave-lines pattern are formed on the surface of the photoresist layer 120, and the period of the wave lines are the same as the light interference lines. This is the basic principle of fabricating the interface texturing of the present invention.

Figure 4:
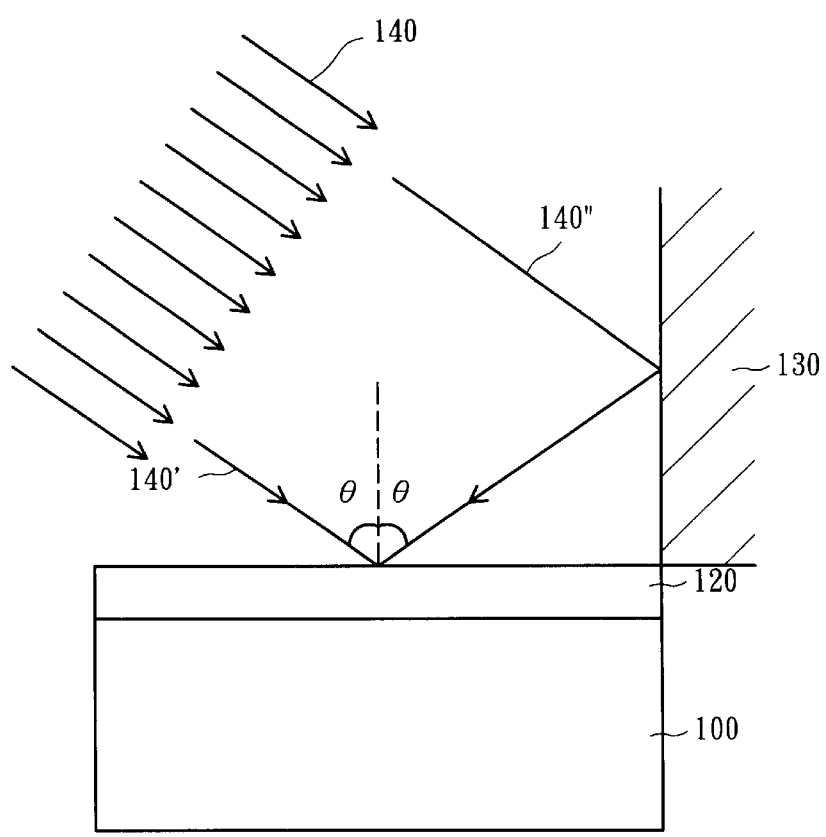
FIG. 4 shows a schematic view of using one laser light beam, wherein portion of it is directly projected to the wafer with an incident angle θ, and portion of it is reflected by a mirror perpendicular to the wafer and also projected to the wafer with an incident angle θ.

Referring to FIG. 4, it shows a schematic view of just applying one light beam to form interference lines by using a mirror. As shown in FIG. 4, the mirror 130 is perpendicular to the substrate 100. A light beam 140, preferred a laser light beam, is projected to the photoresist layer 120 and the mirror 130. One portion of the light beam 140' is directly projected to the photoresist layer 120 with an incident angle θ. The other portion of the light beam 140" is projected to the mirror 130 and reflected by the mirror 130, and then also projected to the photoresist layer 120 with an incident angle θ. The light beam 140' and the light beam 140" are overlaid to form interference lines and then projected to the photoresist layer 120 to complete the exposure step. The embodiment has an advantage of subtracting one light source by using the mirror 130. However, the preferred embodiment of the invention has been illustrated and described, it will be appreciated that the present invention is not limited in using mirror, various changes can be made therein without departing from the spirit and scope of the invention.

The process of fabricating the interface texturing of the present invention will be then described. The present invention just takes a semiconductor light-emitting device for the embodiment to prevent confusing the characteristic of the invention. But, the interface texturing of the invention can also be applied to other light-emitting device, such as organic light-emitting device (O-LED).

Figure 5:
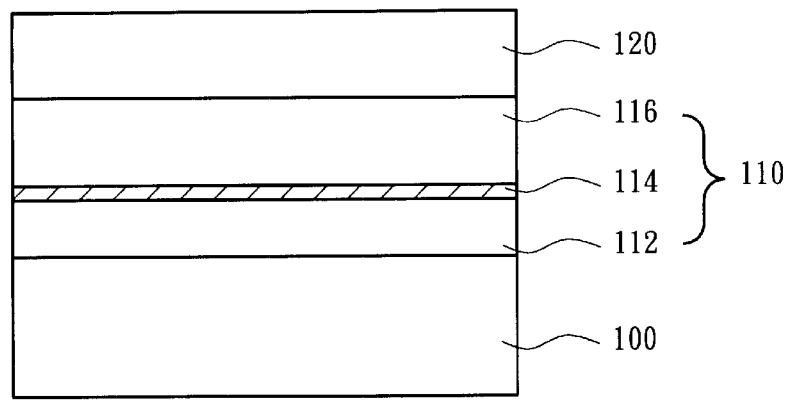
FIGS. 5A–5C are schematic cross-sectional views of fabricating the interface texturing according to the present invention.
Figure 5:
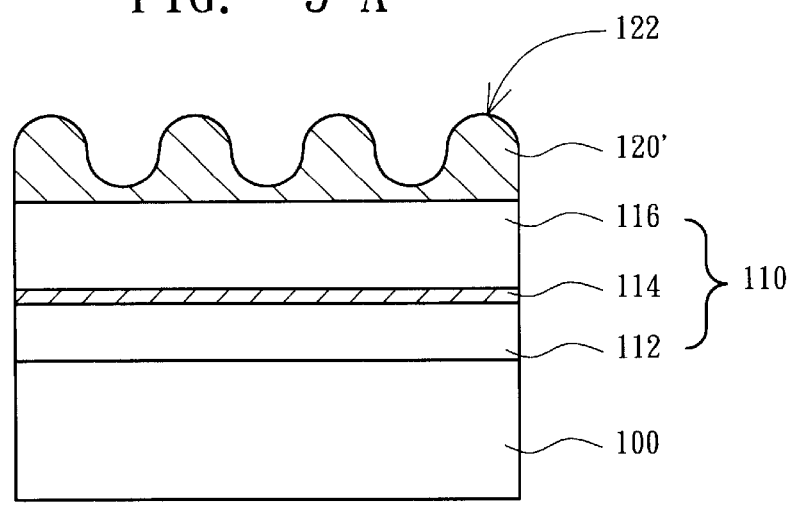
Figure 5:
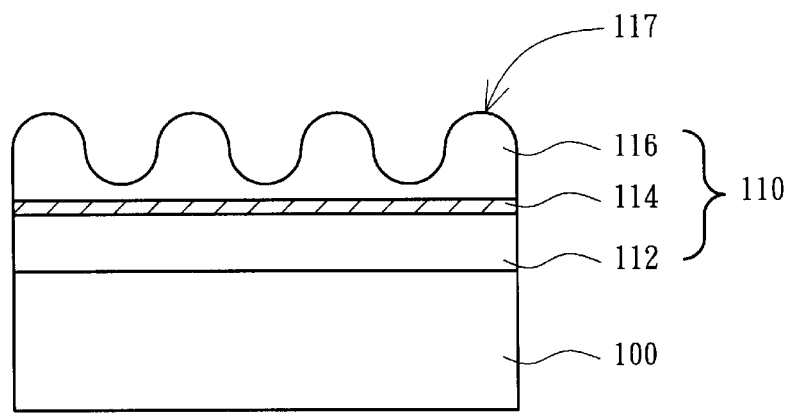

Referring to FIG. 5A, a substrate 100, such as a semiconductor wafer, is provided. A luminescent layer, such as an epitaxial layer 110, is formed on the substrate 100, as shown in the FIG. 5A. The epitaxial layer 110 is composed of a window layer 112 and a window layer 116, and a p-n junction active layer 114 interlocated between the window layer 112 and the window layer 116. The epitaxial layer 110 is usually made of gallium arsenide (GaAs) related compound, such as GaAs and AlGaAs, and the energy gap of the p-n junction active layer 114 is smaller than that of the window layer 112 and the window layer 116, i.e. if a material of the p-n junction active layer 114 is $Al_xGa_{1-x}As$ and a material of the window layer 112 and the window layer 116 is $Al_yGa_{1-y}As$, an aluminum content x of p-n junction active layer 114 is smaller than an aluminum content y of the window layer 112 and the window layer 116 and is greater than or equal to 0. Besides, the epitaxial layer 110 can also be made of GaInP or AlGaInP, and the energy gap of the p-n junction active layer 114 is smaller than that of the window layer 112 and the window layer 116, i.e. if a material of the p-n junction active layer 114 is $(Al_xGa_{1-x})_zInP$ and a material of the window layer 112 and the window layer 116 is $(Al_yGa_{1-y})_zInP$, an aluminum content x of p-n junction active layer 114 is smaller than an aluminum content y of the window layer 112 and the window layer 116 and is greater than or equal to 0. Sometimes some dopant, such as aluminum (Al) is doped into the window layer 112 and the window layer 116 to improve the electric conductivity of the window layer 112 and the window layer 116.

A photoresist layer 120 generally made of photoactive compound (PAC) is coated on the epitaxial layer 110. The photoresist layer 120 is not too thick and just need enough to form textured surface, or it is a disadvantage to perform subsequent etching process.

Referring to FIG. 5B, a holographic exposure step is performed. As shown in FIG. 3 and FIG. 4, two coherent light beams are overlaid to form interference lines, and projected to the photoresist layer 120 to perform a first exposure step. This results in that one-dimension periodical wave-lines are formed on the photoresist layer 120. The whole substrate 100 is then rotated 90 degree. A second exposure step is performed to get two-dimension ordered textured pattern and therefore improves the roughness of the surface. If desired, after the first exposure step, the substrate 100 is rotated 60 degree and the second exposure step is performed. And then the substrate 100 is rotated 60 degree again and a third exposure step is performed to get more perfect roughness. After a developing step, portion of the photoresist layer 120 is removed. Therefore, a patterned photoresist layer 120' having an ordered textured surface pattern 122 is formed.

Referring to FIG. 5C, a pattern transferring step is then performed. The ordered textured surface pattern 122 is transferred to the under window layer 116 by an etching process, such as a wet etching process or a dry etching process. Hence, a textured surface 117 is formed on the window layer 116 to improve the light extraction efficiency of the semiconductor LED. In the embodiment, the window layer 116 of the LED is composed of a semiconductor material, and the ambient is air, so the interface texturing in the embodiment of the invention is textured surface 117.

In addition, electrode portion (not shown in the Figs.), can be directly formed on the top of the window layer 116 and the bottom of the substrate 100 and then fabricating the textured surface 117 step is performed, or after the textured surface 117 is formed and then electrode portion is formed on the top of the window layer 116 and on the bottom of the substrate 100.

Figure 6:
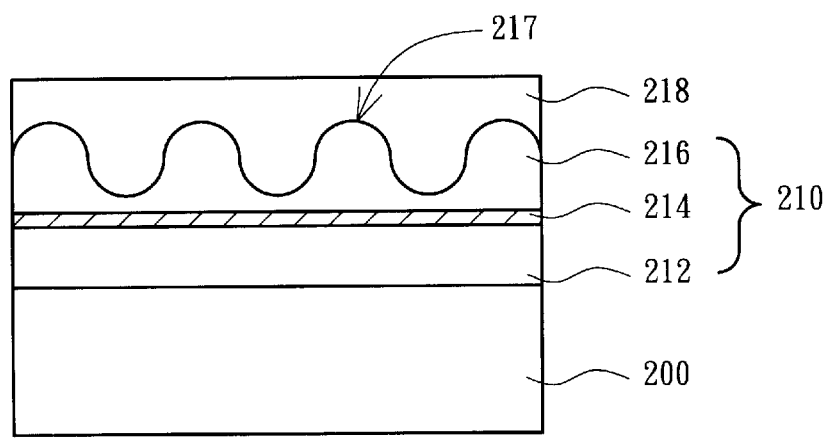
FIG. 6 shows a schematic view of coating a transparent epoxy layer over the textured surface according to another embodiment of the present invention.

Referring to FIG. 6, it is a schematic cross-sectional view of another embodiment of the present invention. An epitaxial layer 210, including a p-n junction active layer 214 and a window layer 212 and a window layer 216, is formed on a substrate 200. The p-n junction active layer 214 is interlocated between the window layer 212 and the window layer 216. A packing resin, such as a transparent epoxy layer 218, is formed on the window layer 216. There is an interface texturing between the window layer 216 and the transparent epoxy layer 218. The light beam ejected from the p-n junction active layer 214 through the transparent epoxy layer 218 into the air. The interface texturing according to the invention can greatly improve the efficiency of the light ejected into the transparent epoxy layer 218.

Figure 7:
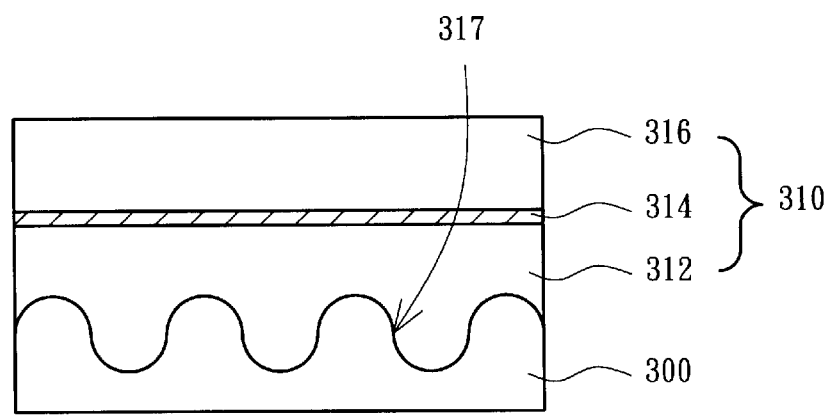
FIG. 7 shows a schematic view of fabricating the interface texturing between the epitaxial layer and the semiconductor substrate according to another embodiment of the present invention.

Referring to FIG. 7, it is a schematic cross-sectional view of another embodiment of the present invention. An epitaxial layer 310, including a p-n junction active layer 314 and a window layer 312 and a window layer 316, is formed on the substrate 300. There is an interface texturing is formed between the substrate 300 and the window layer 312. Portion of the light ejected from the p-n junction active layer 314 is reflected in the interface texturing and changed the next incident angle to the window layer 316, i.e. improves the probability of the light transmission in the interface, so the light extraction efficiency can be increased.

The above described embodiments of the present invention discloses applications of the interface texturing, but the interface texturing not limits on the top and bottom of the epitaxial layer. For example, it can also be formed on the sidewall of the epitaxial layer to improve extraction efficiency if needed.

According to the above description, the present invention provides an interface texturing for a light-emitting device. Interference lines are formed by using two overlaid coherent light beams to perform at least one exposure step, and thereby a textured pattern is formed on the photoresist surface. The textured photoresist pattern is then transferred to a wafer under the photoresist layer to form a desired interface texturing on the wafer. The interface texturing according to present invention can make the total reflected light has a different incident angle to the interface next time to increase the probability of the light transmission in the interface between the LED and the ambient. Therefore, the total light extraction efficiency can be improved and the lightness of the LED can be higher to increase its worth.

As is understood by a person skilled in the art, the foregoing preferred embodiments of the present invention are illustrations of the present invention rather than limitations of the present invention. It is intended to cover various modifications and similar arrangements included within the spirit and scope of the appended claims, the scope of which should be accorded the broadest interpretation so as to encompass all such modifications and similar structure.

What is claimed is:

1. A semiconductor epitaxial structure for a light-emitting device, comprising:
   a first window layer;
   a p-n junction active layer stacked on the first window layer; and
   a second window layer stacked on the p-n junction active layer, and the second window layer having a textured surface, wherein the textured surface is caused by a plurality of interference lines formed by a plurality of overlaid coherent light beams, and a method of forming the textured surface comprises:
      forming a photoresist layer on the second window layer;
      performing a first exposure process, which is to project the interference lines formed by the overlaid coherent light beams to the photoresist layer;
      rotating the photoresist layer 60 degrees;
      performing a second exposure process, which is to project the interference lines formed by the overlaid coherent light beams to the photoresist layer;
      rotating the photoresist layer 60 degrees in the same direction continuously;
      performing a third exposure process, which is to project the interference lines formed by the overlaid coherent light beams to the photoresist layer;
      performing a developing process to form a textured pattern on a surface of the photoresist layer; and
      performing an etching process to transfer the textured pattern of the photoresist layer to the second window layer.

2. The structure according to claim 1, wherein a material of the p-n junction active layer is selected from a group consisting of GaAs and $Al_xGa_{1-x}As$, and a material of the first window layer and the second window layer is selected from a group consisting of GaAs and $Al_yGa_{1-y}As$ ($0 \leq x<y$), and an energy gap of the p-n junction active layer is smaller than an energy gap of the first window layer and the second window layer.

3. The structure according to claim 1, wherein a material of the p-n junction active layer is selected from a group consisting of GaInP and $(Al_xGa_{1-x})_zInP$, and a material of the first window layer and the second window layer is selected from a group consisting of GaInP and $(Al_yGa_{1-y})_xInP$ ($0 \leq x<y$), and an energy gap of the p-n junction active layer is smaller than an energy gap of the first window layer and the second window layer.

4. The structure according to claim 1, wherein after performing the first exposure process, further comprises:
   rotating the photoresist layer 90 degrees; and
   performing an additional exposure process, which is to project the interference lines formed by the overlaid coherent light beams to the photoresist layer.

5. The structure according to claim 1, wherein the overlaid coherent light beams are a plurality of overlaid coherent laser light beams.

6. The structure according to claim 1, further comprises a transparent layer over the second window layer, wherein the transparent layer is formed after transferring the textured pattern of the photoresist layer to the second window layer, and a material of the transparent layer comprises epoxy.

* * * * *